United States Patent [19]

Boeke

[11] Patent Number: 5,006,671
[45] Date of Patent: * Apr. 9, 1991

[54] GLASS-CLAD SUPERCONDUCTING WIRE

[76] Inventor: Jan Boeke, P.O. Box 2327, Chapel Hill, N.C. 27514

[*] Notice: The portion of the term of this patent subsequent to Jan. 1, 2008 has been disclaimed.

[21] Appl. No.: 247,898

[22] Filed: Sep. 22, 1988

Related U.S. Application Data

[63] Continuation-in-part of Ser. No. 234,271, Aug. 19, 1988.

[51] Int. Cl.$^5$ .................... H01B 12/00; H01L 39/24
[52] U.S. Cl. .................... 174/125.1; 29/599; 505/1; 505/887; 505/918
[58] Field of Search .............. 174/125.1; 29/599; 505/887, 884, 918, 1

[56] References Cited

U.S. PATENT DOCUMENTS

| | | | |
|---|---|---|---|
| 3,619,479 | 11/1971 | Bogner | 174/125.1 |
| 3,758,701 | 9/1973 | Schmidt | 29/599 X |
| 4,044,457 | 8/1977 | Strauss et al. | 505/918 X |
| 4,558,512 | 12/1985 | Chaussy et al. | 174/125.1 X |
| 4,762,754 | 8/1988 | Nellis et al. | 428/552 |

FOREIGN PATENT DOCUMENTS

| | | | |
|---|---|---|---|
| 281474 | 9/1988 | European Pat. Off. | 29/599 |
| 285169 | 10/1988 | European Pat. Off. | 29/599 |
| 2519230 | 11/1976 | Fed. Rep. of Germany | 174/125.1 |
| 2142256 | 1/1973 | France | 174/125.1 |
| 165206 | 12/1981 | Japan | 174/125.1 |
| 10526 | 2/1982 | Japan | 174/125.1 |

OTHER PUBLICATIONS

Okada, M. et al.: Fabrication of Ag-Sheathed Ba-Y-Cu Oxide Superconductor Tape; Japanese J. of Appl. Phys.; vol. 27, No. 2; Feb. 88.
Ohmatsu, K. et al.; Superconducting Wires of High Tc Oxides; Japanese Journal of Applied Physics; vol. 26 (1987), Supplement 26-3.
Sadaka, N. et al.; Fabrication and Superconducting Properties of High Tc Oxide Wire; Mat. Res. Soc. Symp. Proc., vol. 99, 1988, Materials Research Society; Symposium held 11-12/87.
Yamada, Y. et al.; Bulk and Wire Type Y-Ba-Cu Oxide Superconductor; Japanese Journal of Applied Physics, vol. 26 (1987), Supplement 26-3.
Maeda et al., A New High-Tc Oxide Superconductor without a Rare Earth Element, Jap. J. Appl. Phys. 27, L209-L210 (1/88).
Subramanian et al., A New High-Temperature Superconductor; $Bi_2Sr_{3-x}Co_xCu_2O_{8+y}$, Science, 239, 1015-1017, (2/88).
Subramanian et al., Crystal Structure of the High Temperature Superconductor $Tl_2Ba_2CaCu_2O$, Nature, 332, 420-422 (3/88).
S. Jin, et al., "High $T_c$ Superconductors—Composite Wire Fabrication", Appl. Phys. Lett., vol. 51(3), pp. 203-204 (1987).
D. W. Murphy et al., "Processing Techniques for the 93K Superconductor $Ba_2YCu_3O_7$", Science, vol. 241, pp. 922-926 (1988).

Primary Examiner—Morris H. Nimmo
Attorney, Agent, or Firm—Connolly and Hutz

[57] ABSTRACT

A glass-clad wire of ceramic superconductive material is produced by filling a glass-lined metal cylinder with a powder of superconductive material, sealing the cylinder ends and drawing the filled, sealed cylinder through dies of progressively smaller size until a predetermined wire size is achieved. The formed wire is then heat treated to assure necessary crystallinity in the superconductor material. Removal of the outer metal coating leaves a glass-clad superconductor wire.

17 Claims, 1 Drawing Sheet

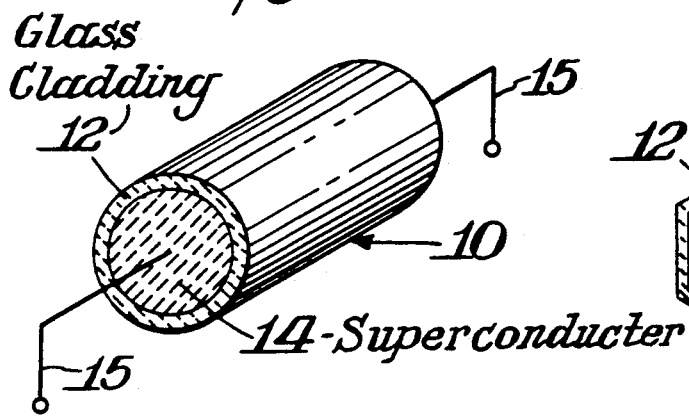
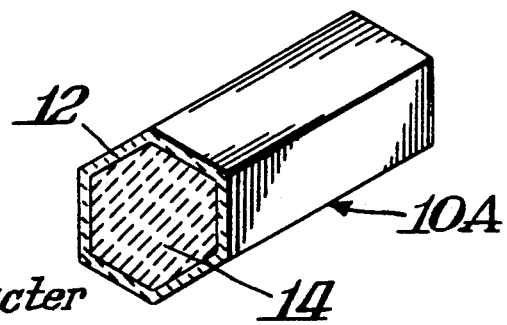
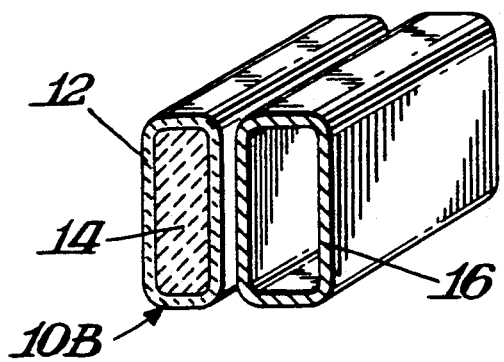
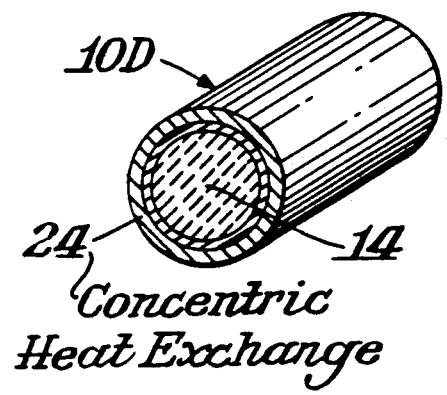
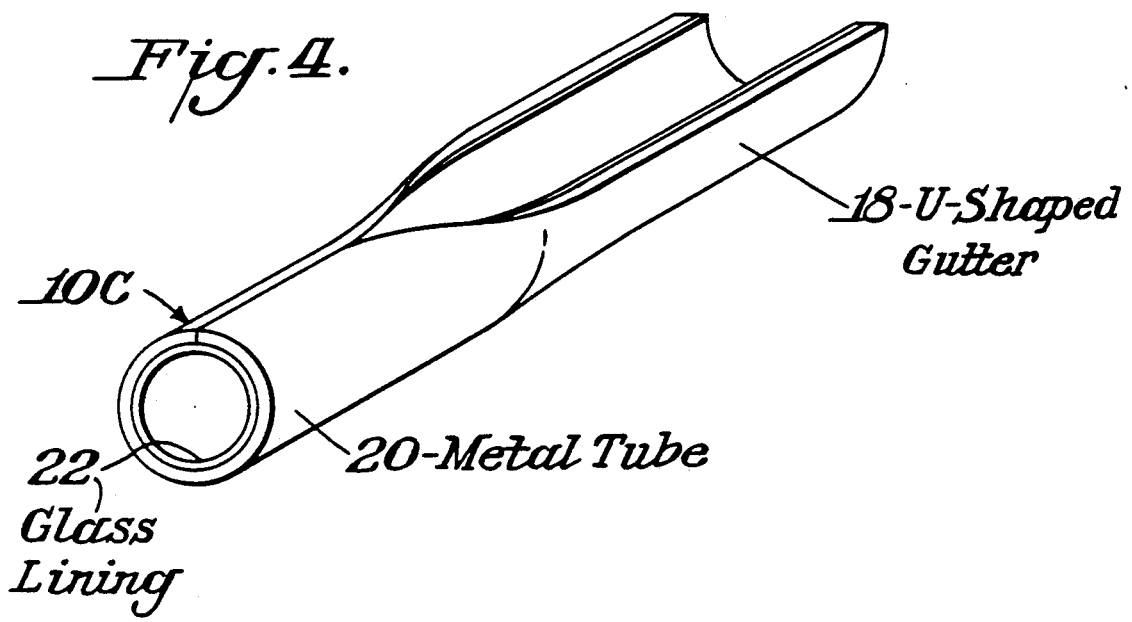

GLASS-CLAD SUPERCONDUCTING WIRE

This is a continuation-in-part of application Ser. No. 234,271 filed Aug. 19, 1988.

The present invention relates to a wire or cable which is superconductive to electrical currents which is encased in glass and a method of its manufacture.

BACKGROUND OF THE INVENTION

Wires and cables used for conducting electricity are made of conducting metal with a wide variety of diameters and cross-sectional profiles. The wire may be surrounded by one or more layers of nonconducting material as insulation, and the insulation may again be surrounded by a shield of woven or solid metal. This again may be surrounded by a protective coating of rubber or polymers. Such an assembly of layers around multiple strands of wire is usually called a cable.

A specialized kind of wire conductor is used as the heating element in kitchen ranges and ovens. A metal conductor, usually made of a higher-resistivity alloy with a high melting point, is enclosed in a hollow tube of a high-temperature and corrosion-resistant alloy. The space between wire and tube is filled with a powdered fire-resistant material such as magnesium oxide which at all temperatures of use is a non-conductor of electricity. Such assembly is sealed at the ends and then drawn through a die of a desired size and configuration, causing the tube and its contents to become thinner and longer. The drawing action is repeated until the tube has been reduced to the desired diameter and cross-sectional profile. The result is a stiff "shielded" wire where the central conducting wire is embedded in a highly compacted insulator and the whole assembly is protected by an external metal shell. Pieces of this wire can be cut and bent into a desired shape. At the ends the conducting core can be connected to current-carrying contacts in order to complete an electric circuit.

It has long been known that at sufficiently low temperatures certain materials become superconductors of electric currents by virtue of extremely low (or absence of) electrical resistance. Much research work is being directed to finding materials which will be superconducting at temperatures above the atmospheric boiling point of liquid nitrogen So far, these materials have been found to be ceramic type materials. A ceramic is a composition of metallic elements and oxygen which is hard and brittle. Such materials are more fully described in the following publications:

(1) Maeda et al., *Jap. J. Appl. Phys.* 27, L209–L210 (1988), describing the $Bi_2$-Sr-Ca-Cu system;

(2) Subramanian et al., *Science*, 239, 1015–1017 (1988), describing the crystal structure of the above system;

(3) Subramanian et al., *Nature*, 332, 420–422 (1988) describing the structure of a Tl-system.

In transmitting electrical energy, a superconductor would be most useful in the form of a wire or cable. However, due to the hard and brittle nature of ceramic materials, the ceramic superconductors do not naturally lend themselves easily to such applications.

It is an object of the present invention to provide a means whereby superconductor materials can be formed into a glass-clad wire or cable. It is a further object of this invention to provide a means for protecting the superconducting wire from damage when the superconducting property is interrupted or lost.

BRIEF DESCRIPTION OF THE INVENTION

To obtain a glass-clad wire of superconducting material according to the present invention, a cylinder of suitable metal or alloy is provided with a glass material lining by enamelling or coating with an adhesive and a layer of glass flock or with a fabric of woven or non-woven glass fiber is capped at one end with highly conductive metal or alloy and the tube is filled with powdered ceramic superconductor material or precursor material for such superconductor. The filled cylinder is then closed with a cap of highly conductive metal or alloy. The cylinder with its contents is then drawn through dies of succeeding smaller diameter and of a desirable hole profile until a thinner wire of desired cross-sectional dimensions is obtained. When the desired wire diameter is obtained, the wire is heated to a temperature required to give the ceramic superconductor the desired crystal characteristics and fused glass material. Before or after the heat treatment the metal outer shell may be removed leaving a glass-clad wire.

To protect the wire from superheating when the superconductive characteristics disappear, a cutout relay can be connected between the end caps of the wire to cause cutoff of the voltage over the wire if that voltage rises to exceed a predetermined value.

BRIEF DESCRIPTION OF THE DRAWING

FIG. 1 illustrates a cross-section of a circular glass-clad wire embodiment of this invention;

FIG. 2 illustrates a cross-section of a hexagonal glass-clad wire embodiment of this invention;

FIG. 3 illustrates a cross-section of a rectangular glass-clad wire embodiment of this invention which also includes an associated parallel cooling tube;

FIG. 4 illustrates a circular glass-clad wire formed from a u-shaped metal gutter.

FIG. 5 illustrates a circular wire of this invention with an associated concentric heat exchange tube.

DETAILED DESCRIPTION

In one embodiment of the present invention a relatively thick-walled piece of cylindrical metal (such as, for example, copper, silver, iron steel or an alloy selected for its particular characteristics) is closed off at one end with a cap of a highly conductive metal such as copper or silver. A tube of woven or non-woven glass fiber slightly smaller diameter than the inner diameter of the closed metal cylinder is placed in the metal cylinder. The form of the glass applied to the interior or the metal cylinder, in addition to woven or non-woven fiber, can be enamel, a bonded layer of powder or flock, or a bonded or non-bonded layer of fabric. Then the capped cylinder is filled with a superconducting material in a powder form. To assure a complete filling, the powder may be compacted in the glass material lined cylinder. When full, the open end of the cylinder is capped with highly conductive metal.

The superconductor powder used to fill the tube can be any powder of a material which has or can be treated to give superconductivity properties. Any superconductor material can be used for the present invention. The presently best superconductors are ceramic-type materials. The differences between these new ceramic superconductors and the previously known metallic superconductors is that when these ceramics are cooled, they will become superconductive at temperatures above the temperature of boiling liquid nitrogen, i.e., 77° Kelvin or −196° C. Whereas the older superconductors needed cooling for at least 70 additional degrees with liquid helium. Considering the difference in price and availability of liquid nitrogen versus liquid helium, this is considered to be an enormous improvement.

Therefore, particular interest has developed in ceramic superconductor materials which have superconductive properties above the boiling temperature of liquid nitrogen, i.e., above about 77° K. For example, three ceramic systems are presently known to be superconductive. Those are the Y-Ba-Cu-O system, the Bismuth Group and the Thallium Group.

The Y-Ba-Cu-O system (also known as the "1-2-3-group") contains oxides of one gram atom of yttrium, two gram atoms of barium and three gram atoms of copper. Compositions of this system become superconductive at about 95° K.

The Bismuth Group contains oxides of one gram atom of calcium, one or two gram atoms of barium, one or two gram atoms of bismuth, and two gram atoms of copper. Members of this group become superconductive at about 110° K.

The Thallium group contains oxides of two gram atoms of thallium, two gram atoms of calcium, two gram atoms of barium and three gram atoms of copper. These materials become superconductive at about 125° C.

The glass used in the present invention is any suitable non-crystalline solid such as those disclosed in *Kirk-Othmer Encyclopedia of Chemical Technology*, Second Edition, volume 10, pages 538-550, Interscience Publishers (1966) which is hereby incorporated by reference. The preferred glass is a silica glass but the invention is not limited thereto. Among the silica glasses are alkali silicate glasses, soda-lime glasses, borosilicate glasses, aluminosilicate glasses, lead glasses, and quartz glass. All these are well known to those skilled in the art.

To convert the capped, superconductor-filled, glass-material lined cylinder into a wire form, the length between the caps, or the whole assembly, is drawn through a die with an opening slightly smaller than the diameter of the tubing. The opening may be circular or may have some other predetermined shape. To soften the metal, an appropriate heat treatment can be applied and the tubing again drawn through a die with a smaller opening. These operations may be repeated until the resulting wire has the desired cross-sectional diameter and configuration.

The thickness of the outer metal layer, the glass cladding thickness and the size of the superconductor wire are determined by the dimensions of the starting metal cylinder and the thickness of the glass lining the cylinder as well as the number of drawings and size reductions. The metal thickness is not critical and its dimensions are primarily dictated by the metal drawing strength and the mechanical strength necessary to support the superconductor wire. For example, copper would need to be thicker than steel. Of course, the size and configuration of the superconductor itself is also not critical and the final dimensions selected should be determined by the required current carrying demands. Generally, wires of 0.05 to 10 cm. are suitable and lengths are only limited by the drawing apparatus employed and the initial tube dimensions.

When the desired cross-section and shape are obtained, the drawn wire is heat treated to convert the powder filling into the desired crystalline habit for best superconductivity and to fuse the glass lining. If this habit is very brittle and if breaking the interconnected crystals of the fill results in less desirable characteristics, the wire may first be wound to form a desired spool and so heat-treated, or in a continuous process the wire may be drawn through a tubular furnace to form a straight wire or a wire which is subsequently wound on a large-diameter support. If the wire is in a relatively small section, it may be heated by electrical resistance by sending a carefully controlled electrical current through the metallic shell or mantle to heat the wire assembly to the desired processing temperature. Another means for heating, either wire sections or continuous wire, is by RF induction. Normally, this heat treatment is in the range of 600–900° C. or to the melting point of the superconductor material. Such heat treatments are known in the art for the purpose of imparting superconductive properties.

After heat treatment the outer metal shell can be removed from the wire leaving a glass-clad superconducting filament. Removal of the metal can be by any suitable means such as abrasion or chemical etching. The reagent used for chemical etching will depend on the elemental chemical nature of the metal shell and its selection is within the skill of the artisan. Preferably, the reagent should be sufficiently active to dissolve the metal shell without substantially affecting the glass cladding or the superconductor material.

This invention is illustrated in the accompanying drawing. FIG. 1 and FIG. 2 show the glass-clad wire of this invention wherein wire 10 and 10A have cross-sectional configurations which are circular and hexagonal, respectively. In each of these two embodiments, superconductor 14 is encased by glass cladding 12. FIG. 3 shows the glass-clad wire of this invention 10B as having a rectangular cross-sectional configuration with superconductor 14 encased in glass-clad 12 and further illustrates use of a parallel tube 16 which is hollow. Parallel tube 16 is mated with the superconducting wire assembly and when a cooling fluid such as liquid nitrogen or other suitable material fluid at low temperatures is pumped through tube 16, the temperature of the superconductor may be regulated and controlled. The hollow tube 16 can be larger or smaller than the wire 10B and can have the same or different cross-sectional configuration. Parallel tube 16 can be of any material suitable for carrying the cooling fluid contemplated. The tube 16 can be arranged substantially parallel to the wire. Also, the hollow tube 16 can partially or completely surround the wire 10B.

Although only three cross-sectional configurations are illustrated, any desirable shapes can be formed. The configurations of FIG. 2 and 3 are especially suitable when a dense packing of several layers of superconductor wire are desired.

In another embodiment, which lends itself to continuous operation, an endless wire of any desired diameter can be produced. In this continuous process, a strip of the outer metal or alloy of a suitable width is provided in a roll of a suitable length; if continuity of length is required, the beginning of another roll may be welded onto the end of the first roll. The metal strip is bent and curved between rollers into a cross-sectional u-shape to form a gutter. Either before or after bending the metal strip, a layer of glass flock, felt or powder, may be applied to the side of the metal strip with or without adhesive which will become or which is the trough of the metal gutter formed. Superconductive powder or its precursor is poured onto the flock, felt or powder in the gutter formed and the gutter with its contents is drawn through an O-shaped opening, which opening may be shaped by rollers, or a die, and the gutter is formed into a closed cylinder. The initial part of the gutter is sealed with a conductive metal plug.

The closed cylinder when so formed will have a longitudinal seam which can be left open or closed by continuous spot welding, brazing or soldering with an alloy having a melting point below the sintering temperature or crystallization temperature of the superconductor powder used, if this operation is deemed advantageous.

If the glass flock, felt or powder is applied to the metal strip with a binder, then it would be appropriate to leave the seam open so that gases created by oxidation or evaporation of the binder during heat treatment can escape through the seam.

By vibration of the closed gutter cylinder, the more complete filling with the powder can be achieved. The so formed cylinder can be drawn through dies as described above for seamless cylinders to compact the powder and to form the desired cross-sectional shape and diameter.

In yet another embodiment, which can be continuous, a metal strip and a strip of glass flock or felt can be wrapped around a mandrel so that the glass layer lies between the metal strip and the mandrel. Preferably, the mandrel is hollow and can serve as a funnel into which the superconductor powder is poured. As the winding progresses, a cylinder is formed continuous and the mandrel is slid out of the cylinder at the same rate the cylinder is formed filled with superconductor powder. Here also, the cylinder so formed will have a longitudinal seam which can be closed by welding, soldering or brazing. Alternatively, another tube can be soldered around the assembly to seal the seam.

In yet another embodiment of the present invention, a strip is formed around a mandrel forming a metallic tube which is provided with a retractable thin-walled cylinder with a diameter smaller than the metal tube. Thus, the retractable cylinder is disposed inside the metal tube forming a fillable void inside the metal cylinder which is filled with superconductor powder and a second annular fillable void between the outside of the retractable cylinder and the inside of the metal tube which second fillable void is filled with a glass in a suitable form, such as powder. When the retractable cylinder is filled with ceramic superconductor powder and the annular space between the metal tube and the cylinder wall is filled with the desired glass material, the retractable cylinder can then be removed so that inside the metal tube, the ceramic superconductor powder is surrounded by glass without a separating solid material between them. The tube is then closed off, drawn and hot processed whereupon the glass powder will sinter or melt together to form a unitary glass tube surrounding the superconducting core.

After the metal-clad, glass-clad superconductor wire is produced by drawing and heat treated as described above, it may be desirable to remove the metal casing. This can easily be achieved by known means such as, for example, by etching with a suitable chemical reagent which will dissolve the metal casing but leave the glass-clad superconductor wire unaffected.

The glass-clad superconductor wires of the present invention are highly suitable for fabricating coils for use in high frequency applications in earth satellites where the operating temperature in outer space is naturally low thus conducive to superconductivity and where a metal shell is undesirable.

When the superconductor wire of this invention is mounted in an electrical circuit for testing or for use, connections to the rest of the circuit are made by way of the highly conducting end caps which seal the tube ends. Larger end pieces of highly conductive metal may be joined onto the caps to insure sufficient electrical carrying capacity to the rest of the circuit of the very high density electrical currents for which superconductive wires may be used when the core material is brought to the superconductive state.

In the superconductive state of the core, very high electrical currents can be carried by the wire without causing an appreciable voltage drop between the ends of the superconducting wire. Hence practically no current flows through the metal shell. Thus the metal tube acts as protective insulation for the superconductor. But if for some reason superconductivity of the core is reduced or lost, the core becomes a relatively poor conductor compared with the metal shell and the voltage between the ends of the wire will increase to a high value in an effort to maintain the current through the wire. Such high voltage would cause a high by-pass current through the metal shell which might cause excessive heating and destroy the wire assembly. For this reason, a fast-acting cut-out relay or circuit breaker should be connected to the metal shell between both ends of the superconductor wire, electrically bridging the wire assembly through the metal shell. If an electric current begins to flow in the metal shell between the ends, this relay or circuit breaker will immediately cut off the connection of the wire with the rest of the electrical circuit and so prevent Joule-heating of the metal shell.

Having fully described the superconductive wire of the present invention, the following example serves to further illustrate a particular aspect of the invention without limitation thereupon.

EXAMPLE

A superconductor material is prepared by thoroughly mixing the following starting materials as chemically pure, fine powders:

152.3 grams of Thallic Oxide ($Tl_2O_3$)
37.4 grams of Calcium Oxide (CaO)
102.3 grams of Barium Oxide (BaO)
79.5 grams of Cupric Oxide (CuO)

The mixture is pressed into pellets or bars and wrapped in gold foil. The foil-wrapped mixture is then heated in a quartz tube under oxygen for one hour at 700° C., and then at 800° C. for two hours.

This resulting superconductor material is crushed and reduced to a fine powder.

A metal tube is prepared by machining a tube of soft, ductile, copper with an outside diameter of 15 mm. and an inside diameter of 11 mm. and a length of about 30 cm. One end of the tube is plugged and capped with welded-on silver.

The metal tube is then filled with the fine superconductor powder through a funnel in the center of the tube, while at the periphery, around the funnel stem, powder of a high-melting silica glass is filled so as to form an outside layer of equal height as the inside powder fill. Vibration is applied while filling to make the powders settle. Then a gold-plated silver plug is welded on the open end.

Then the tube is drawn through successively smaller round dies until the outside diameter is reduced to the desired dimension of about 5mm and 270cm long. Then the tube as a wound coil is heated by placing it in a box furnace at 900° C. in an atmosphere of 97% nitrogen and 3% hydrogen to avoid oxidation of the copper. The heat treatment fuses the annular layer of glass powder and also sinters and crystallizes the core which now is brittle and should not be bent anymore.

The copper shell is then etched away with a ferric chloride solution and the resulting glass-clad superconductor wire coil is washed and dried. The coil is now suitable for testing in liquid nitrogen.

What is claimed is:

1. A method for producing a glass-clad wire of superconducting material which comprises:
   (a) filling a hollow metal container which is sealed at one end with an electrically conductive metal with a superconductive material, providing a layer of glass between the tube and the superconductive material whereby the material is annularly surrounded by a glass layer, and sealing the other end of the tube with an electrically conductive metal,
   (b) drawing at least a portion of the filled container through at least one size-reducing die whereby the diameter of the container and its contents is reduced to a wire size, and
   (c) heat treating the drawn wire to provide crystallinity in the superconductor material.

2. A method according to claim 1 wherein step (a) comprises filling a hollow metal container, sealed at one end with an electrically conductive metal and having an interior surface lined with a glass material, with a superconductive material and sealing the other end of the tube with an electrically conductive metal.

3. A method according to claim 1 wherein step (a) comprises filling a hollow metal container, sealed at one end with an electrically conductive metal and having an interior surface lined with glass powder, with a superconductive material and sealing the other end of the tube with an electrically conductive metal.

4. A method according to claim 3 wherein the heat treatment comprises fusing glass powder into a unitary mass and after the heat treatment the metal container of the drawn wire is removed.

5. A method according to claim 1 wherein step (a) comprises filling a hollow metal container, sealed at one end with an electrically conductive metal simultaneously with a granular or powder of superconductive material surrounded by an annular glass layer in granular or powder form between the material and the container.

6. A method according to claim 5 wherein the heat treatment (c) comprises fusing the glass granules or powder into a unitary mass and after the heat treatment the metal container of the drawn wire is removed.

7. A method according to claim 1 wherein step (c) comprises heat treating the drawn wire and thereafter removing the metal container of the drawn wire.

8. A method according to claim 7 wherein removing the metal container is by chemical etching.

9. A method for the continuous production of a superconductor wire which comprises:
   (a) forming a strip of metal into a u-shaped gutter or forming the strip around a mandrel to form a cylinder,
   (b) filing said gutter or cylinder with glass annularly surrounding a powder of a superconductor material,
   (c) forming said gutter into a tube to surround and enclose the superconductor material,
   (d) drawing the filled sealed gutter or formed cylinder through at least one size reducing die to form a wire, and
   (e) heat treating the formed wire.

10. A method according to claim 9 wherein step (a) comprises forming a cylinder which has a longitudinal seam and sealing the seam by welding, soldering or brazing.

11. A method according to claim 9 wherein step (a) additionally comprises providing the surface of the metal strip which forms the interior of the cylinder with a surface coating of glass before or after the forming.

12. A method according to claim 9 wherein step (e) comprises heat treating the formed wire and thereafter removing metal from the drawn wire.

13. A method according to claim 12 wherein removing the metal is by chemical etching.

14. A composite article which comprises a wire of a ceramic superconductive material surrounded by an annular sintered-on layer of glass and at least two spaced apart means for electrical connection with said superconductive material.

15. A composite article according to claim 14 wherein the glass is a silica glass.

16. A composite article according to claim 14 which further comprises a layer of metal overlying the glass.

17. A composite article according to claim 16 wherein the metal is iron or steel.

* * * * *